United States Patent [19]

Hwang et al.

[11] Patent Number: 5,410,276

[45] Date of Patent: Apr. 25, 1995

[54] RF MODULATION USING A PULSED DC POWER SUPPLY

[75] Inventors: William B. Hwang; Michael Brand, both of Los Angeles; Ronnie B. Chan, Gardena; Robert S. Boiles, Torrance, all of Calif.

[73] Assignee: Hughes Aircraft Company, Los Angeles, Calif.

[21] Appl. No.: 174,541

[22] Filed: Dec. 28, 1993

[51] Int. Cl.$^6$ .............................................. H03K 7/04
[52] U.S. Cl. ..................... 330/297; 332/113
[58] Field of Search ............... 307/260, 265, 268, 529; 330/297; 332/109, 110, 112, 113

[56] References Cited

U.S. PATENT DOCUMENTS 3,898,589  8/1975  Tustison ............................ 332/113
5,281,925  1/1994  Hulick ............................ 307/268 X Primary Examiner—Steven Mottola
Attorney, Agent, or Firm—L. A. Alkov; W. K. Denson-Low

[57] ABSTRACT

Circuits for modulating an RF input signal applied to an RF high power amplifier to produce a modulated RF output signal. The present invention employs a VHF power supply or converter with a modulation control circuit that enables the power supply to be pulsed at frequencies commensurate with a radar in which it is employed, for example. Modulation of the high power amplifier is accomplished by applying a pulsed voltage output signal to a DC bias input of the high power amplifier. More particularly, the modulation control circuit receives a logic control signal, generates a pulse control signal in response thereto, and modulates a DC input signal processed by the converter. The VHF converter receives and modulates the DC input signal in response to the pulse control signal to cause the pulsed voltage output signal from the converter to pulse at a rate and duty cycle determined by the logic control signal. The output signal modulates the RF input signal amplified by the RF high power amplifier. The modulation control circuit comprises a digital input buffer for receiving the logic control signal, a driver circuit for generating the pulse control signal, and a modulation switch coupled to the converter for modulating the DC input signal in response to the logic control signal. This causes the output of the converter to pulse at a rate and duty cycle determined by the logic control signal. The converter may comprise a common emitter converter or a common base converter. The VHF converter comprises input and output wave shaping networks, the common base or common emitter inverters, an impedance matching network, and a rectifier/filter. The rectifier/filter is adapted to convert a sinusoidal signal produced by the inverter into the output signal that has a desired DC voltage for application to the high power amplifier.

8 Claims, 2 Drawing Sheets

5,410,276

RF MODULATION USING A PULSED DC POWER SUPPLY

This invention was made with Government support under Contract No. F33615-89-C-1073 awarded by the Department of the Air Force. The Government has certain fights in this invention.

BACKGROUND

The present invention relates generally to RF high power amplifiers, and more particularly, to circuits for modulating the output signal of an RF high power amplifier.

One conventional RF high power amplifier modulation technique utilizes a series pass switch to toggle on and off a DC bias to the RF high power amplifier. This technique is inefficient since power is dissipated in the switch and its driver. In addition to the switch and driver, the modulation circuitry requires a large quantity of energy storage capacitance on the array and a unique DC bias voltage. These circuits complicate the amplifier, reduce amplifier reliability, and occupy valuable circuit board area. The energy storage capacitance adds a significant weight penalty to the antenna, and is a potential failure mechanism, due to the large amount of energy that is stored.

Accordingly, it is an objective of the present invention to provide for circuits for modulating the output signal of an RF high power amplifier and that overcome the limitations of conventional designs.

SUMMARY OF THE INVENTION

The present invention comprises circuits that modulate the output of an RF high power amplifier such as may be employed in an active array radar system, for example. The present invention employs a VHF power supply or converter and a modulation control circuit that enables the power supply to be pulsed at frequencies commensurate with the radar. Modulation of the high power amplifier is accomplished by generating and applying a pulsed voltage to a DC bias input of the amplifier. The ability to modulate the high power amplifier using the VHF power supply while satisfying active array timing and ripple requirements is an improvement over conventional circuits, and has significant benefits in terms of efficiency, size, weight, reliability and cost for the active array radar system.

More particularly, the present invention comprises an RF high power amplifier for amplifying an RF input signal applied thereto. A modulation control circuit is provided for receiving a logic control signal and for generating a pulse control signal in response thereto. A VHF converter is coupled to the RF high power amplifier, to the modulation control circuit, and to a voltage source for generating a pulsed DC output signal in response to the logic control signal. The pulsed DC output signal is adapted to pulse at a rate and duty cycle determined by the logic control signal. The pulsed DC output signal is adapted to modulate the RF input signal amplified by the RF high power amplifier to produce a modulated RF output signal.

The modulation control circuit comprises a digital input buffer that is adapted to receive the logic control signal, a driver circuit that is adapted to generate the pulse control signal, and a modulation switch coupled between the driver circuit and the converter. Bu modulating the DC input power derived from the voltage source in response to the logic control signal, the output signal is pulsed at a rate and duty cycle determined by the logic control signal. The VHF converter may comprise a common emitter converter, or a common base converter, for example. In the common base converter configuration, the emitter of a transistor is adapted to receive a clock input signal, and is coupled to the modulation control circuit. In the common emitter converter configuration, the base of a transistor is adapted to receive the clock input signal, and the modulation control circuit is coupled to the emitter of the transistor.

The VHF converter comprises an input wave shaping network and an output wave shaping network. An inverter is coupled between the input and output wave shaping networks for converting a DC input signal derived from the voltage source ($V_{CL}$) into a sinusoidal signal. An impedance matching network and a rectifier/filter are coupled between the output wave shaping network and the RF high power amplifier for rectifying and filtering the sinusoidal signal to produce the pulsed DC output signal that is coupled to the RF high power amplifier.

Modulation of the high power amplifier using the pulsed VHF converter significantly reduces the amount of energy storage capacitance located on an active antenna array coupled thereto, for example. Using the present invention in a 1000 element antenna array eliminates approximately 19 pounds of capacitance, reduces stored energy by 17 joules, and decreases the antenna depth, compared with prior modulation techniques. Since pulse generation is accomplished within the power supply, the circuitry conventionally used to modulate the high power amplifier is eliminated. This amounts to the elimination of a driver circuit, a power transistor switch, miscellaneous capacitors and a bias voltage. The elimination of these components reduces the physical size of the module controlling the high power amplifier, and improves reliability by approximately 30 percent. Approximately 1 watt per transmit/receive module is saved by eliminating the power switch and its driver. In a typical array this adds up to over one kilowatt of power savings. The present invention may be used to improve the performance of any pulsed active array through a reduction in component count, power dissipation and transmit/receive module size, weight and cost.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
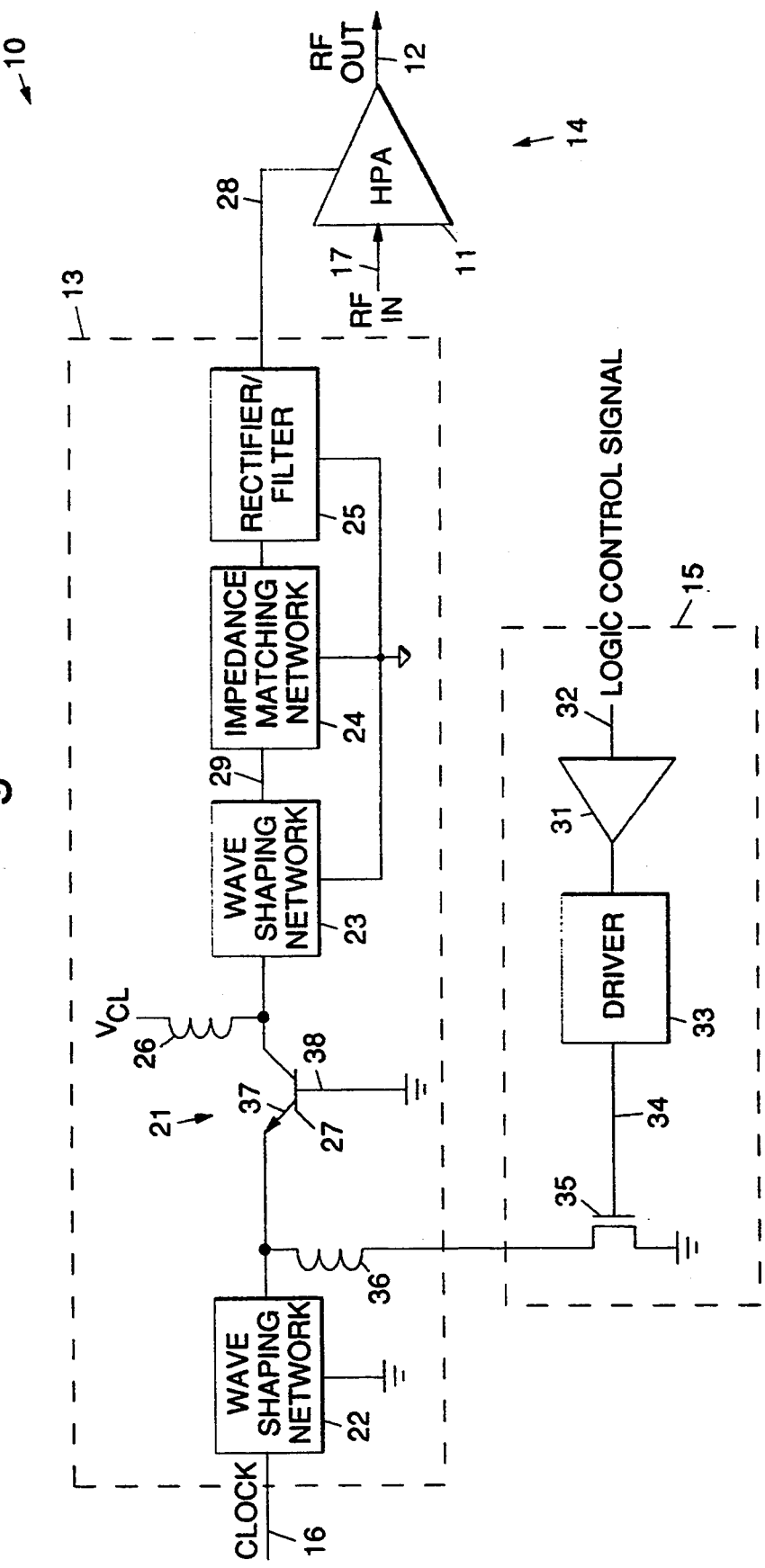
FIG. 1 is a block diagram of a first embodiment of a circuit for modulating the output signal of an RF high power amplifier in accordance with the principles of the present invention.

Referring to the drawing figures, FIG. 1 is a block diagram of a first embodiment of a circuit 10 in accordance with the principles of the present invention that is adapted to modulate an RF input signal 17 that is applied to an RF high power amplifier 11 to produce a modulated RF output signal 12. The circuit 10 is comprised of a VHF converter 13 that is coupled to a load 14 comprising the high power amplifier 11, and a modulation control circuit 15 that is coupled to the VHF converter 13. In this first embodiment of the circuit 10, the VHF converter 13 comprises a common base inverter 21 coupled between input and output wave shaping networks 22, 23. The common base inverter 21 includes a power transistor 27, and an inductor 26 coupled to a voltage source $V_{CL}$. The common base inverter 21 is adapted to convert DC input power derived from the voltage source $V_{CL}$ into a sinusoidal power signal 29. This is accomplished through the application of a clock signal 16 to the inverter 21.

An impedance matching network 24 is coupled to the output wave shaping network 23 and is used to efficiently transfer the output of the common base inverter 21 to a rectifier/filter 25. The base 38 of the power transistor 27 is coupled to the wave shaping networks 22, 23, the impedance matching circuit 24 and to the rectifier/filter 25 in a conventional manner as shown in FIG. 1. The rectifier/filter 25 is adapted to convert the sinusoidal waveform produced by the common base inverter 21 into a desired DC voltage for application to the high power amplifier 11. More specifically, the impedance matching network 24 and rectifier/filter 25 rectify and filter the sinusoidal signal 29 to produce a pulsed DC voltage output signal 28 that is coupled to a DC source input or DC bias input of the RF high power amplifier 11.

The modulation control circuit 15 is comprised of a digital input buffer 31 that receives a logic control signal 32, and that is coupled to a driver circuit 33 that generates a pulse control signal 34 required to toggle a modulation switch 35. An inductor 36 is coupled between the switch 35 and an emitter 37 of the transistor 27. The modulation switch 35 is adapted to modulate the DC power passing through the transistor 27, thereby causing the output signal 28 of the converter 21 to pulse at a rate and duty cycle determined by the logic control signal 32. The pulsed DC voltage output signal 28 in turn modulates the RF output signal 12 of the RF amplifier 11.

The VHF converter 13 provides for high power processing density and extremely fast regulation loop response power conditioning which are prerequisites for the modulation function provided by the present invention. High power processing capability reduces the size of the converter 13, allowing it to be placed in very close proximity to the high power amplifier 11. This placement minimizes the coupling of noise to the RF output signal 12 and retains crisp rise and fall edges. Fast loop response is required to insure fast edges on the processed RF signal and to maintain regulation of the signal within the pulse.

Figure 2:
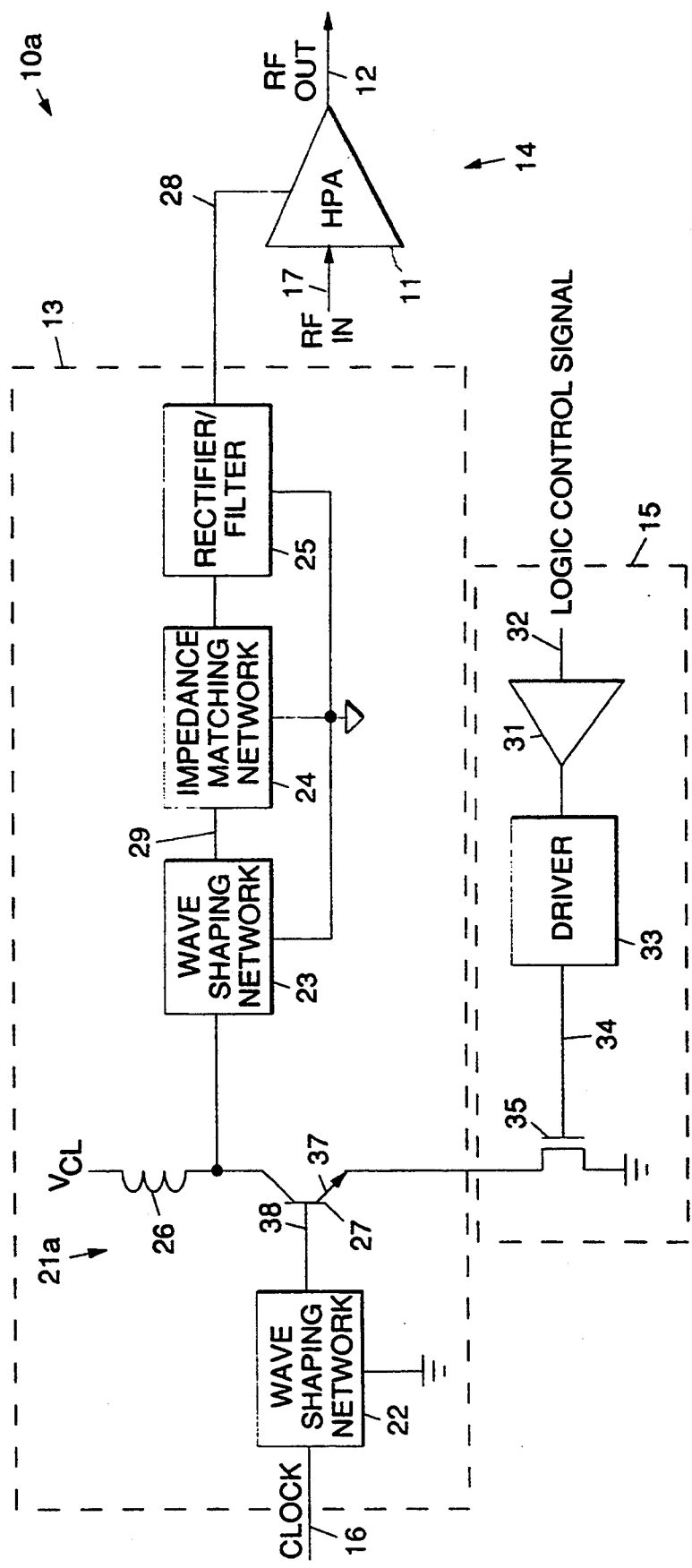
FIG. 2 is a block diagram of a second embodiment of a circuit for modulating the output signal of an RF high power amplifier in accordance with the principles of the present invention.

FIG. 2 is a block diagram of a second embodiment of a circuit 10a in accordance with the principles of the present invention. FIG. 2 is a variation of the circuit 10 shown in FIG. 1, wherein the common base converter 21 is replaced by a common emitter converter 21a. The modulation switch 35 is now located in series with the emitter 37 of the inverter transistor 27. All other functions and operating characteristics described with reference to the circuit 10 remain the same in the second embodiment. In both circuits 10, 10a, the pulsed DC voltage output signal 28 is applied to the high power amplifier 11. The RF input signal 17 applied to the high power amplifier 11 is modulated at the duty cycle and frequency of this applied bias signal comprising the pulsed DC voltage output signal 28 to produce the modulated RF output signal 12.

The circuit 10 of the present invention was tested, and it was found that it is capable of modulating a 2 watt high power amplifier 11 at pulse rates from 100 Hz to 300 KHz. Rise and fall times of the pulsed DC voltage output signal 28 varied from 200 nsec to 1 usec depending upon the amount of overshoot.

Modulation of the high power amplifier 11 using the pulsed VHF converter 21 significantly reduces the amount of energy storage capacitance located on an active array antenna coupled thereto, for example. Using the present invention with a 1000 element antenna array eliminates approximately 19 pounds of capacitance, reduces storm energy by 17 joules, and decreases the antenna depth, compared with arrays employing conventional modulation techniques. Since pulse generation is accomplished within the power supply, the circuitry conventionally used to modulate the module containing the high power amplifier 11 is eliminated. This amounts to the elimination of a driver circuit, a power transistor switch, miscellaneous capacitors and a bias voltage. The elimination of these components reduces the physical size of the transmit/receive module, the high power amplifier 11, and improves reliability by approximately 30 percent. Approximately 1 watt per transmit/receive module is saved by eliminating the power switch and its driver. In a typical array this adds up to over one kilowatt of power savings. The present invention may be used to improve the performance of any pulsed active array through a reduction in component count, power dissipation and transmit/receive module size, weight and cost.

Thus, there have been described new and improved circuits for modulating the output signal of an RF high power amplifier. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:
1. Apparatus comprising:
an RF high power amplifier for amplifying an RF input signal;
a modulation control circuit for receiving a logic control signal and generating a pulse control signal in response thereto, wherein the modulation control circuit comprises:
  (i) a digital input buffer that is adapted to received the logic control signal,
  (ii) a driver circuit that is adapted to generate the pulse control signal, and
  (iii) a modulation switch coupled between the driver circuit and the converter for modulating DC input power derived from the voltage source in response to the logic control signal to cause the pulsed DC output signal to pulse at a rate and duty cycle determined by the logic control signal; and
a VHF converter coupled to RF high power amplifier, to the modulation control circuit, and to a voltage source for generating a pulsed DC output signal in response to the logic control signal, which pulsed DC output signal is adapted to pulse at a rate and duty cycle determined by the logic control signal, and wherein the pulsed DC output signal is adapted to modulate the RF input signal amplified by the RF high power amplifier to produce a modulated RF output signal.

2. The apparatus of claim 1 wherein the VHF converter comprises a common base converter wherein an emitter of the transistor is adapted to receive the clock input signal, and wherein the modulation control circuit is coupled to the emitter of the transistor.

3. The apparatus of claim 1 wherein the VHF converter comprises a common emitter converter wherein a base of the transistor is adapted to receive the clock input signal, and wherein the modulation control circuit is coupled to the emitter of the transistor.

4. Apparatus comprising:
an RF high power amplifier for amplifying an RF input signal;
a modulation control circuit for receiving a logic control signal and generating a pulse control signal in response thereto; and
a VHF converter coupled to RF high power amplifier, to the modulation control circuit, and to a voltage source for generating a pulsed DC output signal in response to the logic control signal, which pulsed DC output signal is adapted to pulse at a rate and duty cycle determined by the logic control signal, and wherein the pulsed DC output signal is adapted to modulate the RF input signal amplified by the RF high power amplifier to produce a modulated RF output signal, wherein the VHF converter comprises:
(i) an input wave shaping network,
(ii) an output wave shaping network,
(iii) an inverter coupled between the input and output wave shaping networks for converting a DC input signal derived from the voltage source into a sinusoidal signal, and
(iv) an impedance matching network and a rectifier/filter coupled between the output wave shaping network and the RF high power amplifier for rectifying and filtering the sinusoidal signal to produce the output signal that is coupled to the RF high power amplifier.

5. The apparatus of claim 4 wherein the VHF converter comprises a common base converter in an emitter of the transistor is adapted to receive the clock input signal, and wherein the modulation control circuit is coupled to the emitter of the transistor.

6. The apparatus of claim 4 wherein the VHF converter comprises a common emitter converter wherein a base of the transistor is adapted to receive the clock input signal, and wherein the modulation control circuit is coupled to the emitter of the transistor.

7. The apparatus of claim 4 wherein the common base converter comprises a power transistor, and an inductor coupled to a voltage source.

8. The apparatus of claim 4 wherein the common emitter converter comprises a power transistor serially coupled through an inductor to a voltage source.

* * * * *